US008674765B2

(12) United States Patent
Mengad

(10) Patent No.: US 8,674,765 B2
(45) Date of Patent: Mar. 18, 2014

(54) FULLY DIFFERENTIAL AMPLIFIER TOPOLOGY TO DRIVE DYNAMIC SPEAKERS IN CLASS AB MODE

(75) Inventor: Zakaria Mengad, Edinburgh (GB)

(73) Assignee: Dialog Semiconductor GmbH, Kirchheim/Teck-Naburn (DE)

(*) Notice: Subject to any disclaimer, the term of this patent is extended or adjusted under 35 U.S.C. 154(b) by 39 days.

(21) Appl. No.: 13/433,900

(22) Filed: Mar. 29, 2012

(65) Prior Publication Data
US 2013/0257535 A1  Oct. 3, 2013

(30) Foreign Application Priority Data

Mar. 27, 2012  (EP) .................................. 12368006

(51) Int. Cl.
*H03F 3/45* (2006.01)
(52) U.S. Cl.
USPC .......................................... 330/255; 330/258
(58) Field of Classification Search
USPC .................. 330/255, 258, 259, 292
See application file for complete search history.

(56) References Cited

U.S. PATENT DOCUMENTS

| 5,428,316 | A * | 6/1995 | Molnar ........................ 330/253 |
| 6,642,788 | B1 | 11/2003 | Abughazaleh |
| 7,170,351 | B2 | 1/2007 | Shimatani |
| 7,315,204 | B2 | 1/2008 | Seven |
| 7,898,330 | B2 | 3/2011 | Eschauzier et al. |
| 2010/0033464 | A1 | 2/2010 | Shimatani |
| 2011/0273230 | A1 | 11/2011 | Draxelmayr |

FOREIGN PATENT DOCUMENTS

WO    WO 2009/063276    5/2009

OTHER PUBLICATIONS

European Search Report 12368006.8-1233 Mail date—Aug. 31, 2012, Dialog semiconductor GmbH.
"A fully balanced, rail-to-rail, 3V, Class-AB operational Amplifier," by Frode Larsen, XP-000825574, May 12, 1996, 4 pgs.
"A Low-Voltage Fully Balanced OTA with Common Mode Feedforward and Inherent Common Mode Feedback Detector," by Ahmed Nader Mohieldin et al., ESSCIRC 2002, Department of Electrical Engineering, Texas A&M University, College Station, Texas 77843, USA, Sep. 2002, pp. 191-194.

* cited by examiner

Primary Examiner — Steven J Mottola
(74) Attorney, Agent, or Firm — Saile Ackerman LLC; Stephen B. Ackerman

(57) ABSTRACT

Circuits and methods to achieve a new fully differential amplifier topology in class AB mode are disclosed. In a preferred embodiment of the disclosure the differential amplifier is diving dynamic speakers. An differential intermediate stage combines four different feedbacks, all sharing four high impedance nodes: main loop regulation feedback, common mode regulation feedback, and output stage quiescent current regulation for both differential output stage branches.

24 Claims, 7 Drawing Sheets

FULLY DIFFERENTIAL AMPLIFIER TOPOLOGY TO DRIVE DYNAMIC SPEAKERS IN CLASS AB MODE

BACKGROUND (1) Technical Field

This disclosure relates generally to the field of audio amplifier circuits and relates more specifically to a fully differential class AB amplifier topology.

(2) Background

Power audio amplifiers are widely used to drive speakers in audio systems. Different classes of audio amplifiers are utilized to provide output signals. For example, class A amplifiers reproduce an entire input signal because an active element is constantly in active mode, hence having high power consumption.

To improve the full power efficiency of the previous Class A amplifier by reducing the wasted power in the form of heat, it is possible to design the power amplifier circuit with two transistors in its output stage producing what is commonly termed as a "push-pull" type amplifier configuration. Push-pull amplifiers use two "complementary" or matching transistors, one being an NPN-type and the other being a PNP-type with both power transistors receiving the same input signal together that is equal in magnitude, but in opposite phase to each other. This results in one transistor only amplifying one half or 180 degrees of the input waveform cycle while the other transistor amplifies the other half or remaining 180 degrees of the input waveform cycle with the resulting "two-halves" being put back together again at the output terminal. Then the conduction angle for this type of amplifier circuit is only 180 degrees or 50% of the input signal. These types of audio amplifier circuits are more generally known as the Class B Amplifier.

The Class AB Amplifier circuit is a compromise between the Class A and the Class B configurations. Both transistors slightly conduct even when no input signal is present.

In the class-D amplifier the input signal is converted to a sequence of higher voltage output pulses. The averaged-over-time power values of these pulses are directly proportional to the instantaneous amplitude of the input signal.

Class-G amplifiers use "rail switching" to decrease power consumption and increase efficiency. These amplifiers provide several power rails at different voltages and switch between them as the signal output approaches each level. Thus, the amplifier increases efficiency by reducing the wasted power at the output transistors.

The most common output driver modes are class AB and class D type; class AB uses the power stage devices in linear mode while class D uses the power devices in switched mode Current practice uses rail-to-rail intermediate stage to drive high/low side power devices. This approach has multiple disadvantages:

In general, battery or output of a charge pump is used to supply the power stage, those same noisy supplies need to propagate to the intermediate stage, feeding noise and compromising PSR. One example of this mechanism is feed-forward through Miller compensation capacitors.

When the supply is varying widely, like in class-G operation, its generally much more difficult to keep the intermediate stage biased in linear mode, requiring complex and larger design to arbitrate between adaptive (sometimes concurrent) controls inside the intermediate stage.

When cascaded low voltage PMOS devices are used, it's generally much more complicated in those topologies to protect their gates from seeing the full supply, especially at start-up.

It is a challenge for engineers to design an audio amplifier the disadvantages cited above.

SUMMARY

A principal object of the present disclosure is to achieve a fully differential amplifier topology.

A further object of the disclosure is to achieve a straight-forward design of an intermediate stage of the amplifier.

A further object of the disclosure is allowing partial use of MOS capacitors (MOSCAPS) for frequency compensation, allowing further area savings.

A further object of the disclosure is to achieve a simpler design allowing large saving in area of the error amplifier.

A further object of the disclosure is to migrate more easily the design from one technology node to another.

A further object of the disclosure is to achieve a better immunity against supply ripple, reducing potential audio buzz (e.g. 217 HZ).

A further object of the disclosure is to achieve a more suitable for ground-centered type of output.

A further object of the disclosure is to achieve an easy adaptation to class-G modulation.

In accordance with the objects of this disclosure a method to achieve a fully differential amplifier operating in class AB mode, comprising an arrangement for differential drive intermediate stage to control a differential loop, a common mode regulation and class AB regulation has been achieved. The method disclosed comprises, firstly, the following steps: (1) providing a fully differential amplifier operating in class AB mode comprising ports for differential input error signals Vip and Vim and for differential output signals Vop and Vom, wherein Vop is generated by a first output branch and Vom is generated by a second output branch wherein each output branch comprising high side and low side devices, wherein the amplifier comprises an output stage and an intermediate stage processing the input signals, and (2) enabling a main loop output common mode regulation by introducing dual differentiation of the input error signal to support common mode regulation by splitting driving signals for a first transistor of each of said output branch from a control path for a second transistor of each of said output branch. Furthermore the method comprises the steps of: (3) reducing a common mode error by decreasing both voltages Vop and Vom if a differential output common mode is higher than a common mode reference, and (4) regulating quiescent currents of both output branches inside the amplifier by sensing a current of a device of each output branch conducting the smallest current, comparing it with an internal reference current in order to regulate the minimum current.

In accordance with the objects of this disclosure a circuit of a fully differential amplifier operating in class AB mode has been achieved. The circuit disclosed firstly comprises: a differential output stage comprising a P and an M branch, wherein each branch comprises a high side device and a low side device and a differential intermediate stage. The differential intermediate stage comprises a first pair of PMOS transistors comprising a first and a second PMOS transistor, amplifying a differential input error signal wherein each transistor generates a driving signal for a correspondent said low side device and a control signal to a correspondent said high side device, wherein the sources of both transistors are connected, a first pair of NMOS transistors wherein a gate of each NMOS transistor is connected at a correspondent high impedance node to a drain of a correspondent transistor of the first pair of PMOS transistors and to a gate of said low side device and a drain of each NMOS transistor is connected to a drain and a gate of a correspondent NMOS transistor of a third pair of NMOS transistors, and said second pair of PMOS transistors, wherein each gate of the second pair of PMOS transistors is connected to a gate of a correspondent high side device forming a current mirror, wherein the each of the PMOS transistors of the second pair are scaled down in a same scale relative to the high side devices. Furthermore the intermediate stage comprises a loop control circuit, a common mode regulation loop circuit, and a class AB regulation loop.

BRIEF DESCRIPTION OF THE DRAWINGS

In the accompanying drawings forming a material part of this description, there is shown.

DESCRIPTION OF THE PREFERRED EMBODIMENTS

Methods and circuits for a fully differential amplifier topology to drive dynamic speakers in class AB mode are disclosed.

Figure 1:
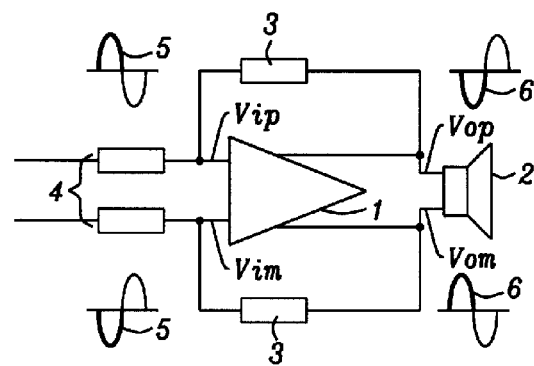
FIG. 1 shows the basic elements of a class AB amplifier in differential mode.

FIG. 1 shows the basic elements of a class AB amplifier in differential mode. FIG. 1 depicts an amplifier 1, receiving differential inputs vip and vim and providing differential outputs vop and vom, loudspeaker 2, feedback resistors 3, and input resistors 4. FIG. 1 also shows input signals 5 and output signals 6.

When a differential audio signal vip and vim is present at the input stage, the difference, or error, between the two inputs vip and vim is amplified to generate fully differential output signals vop and vom.

The bold lines of the input/output signals 5-6 indicate that each device operates the same way as in class B amplifiers over half the waveform, but also conducts a small amount on the other half. As a result, the region where both devices simultaneously are nearly off (the "dead zone") is reduced. The result is that when the waveforms from the two devices are combined, the crossover is greatly minimized or eliminated altogether.

The input/feedback resistors 3-4 are arranged in a switched network to achieve a programmable closed loop gain of the amplifier 1 (PGA). A speaker equivalent resistive load in portable applications is typically 32 Ohms but can be as low as 4 Ohms.

Figure 2:
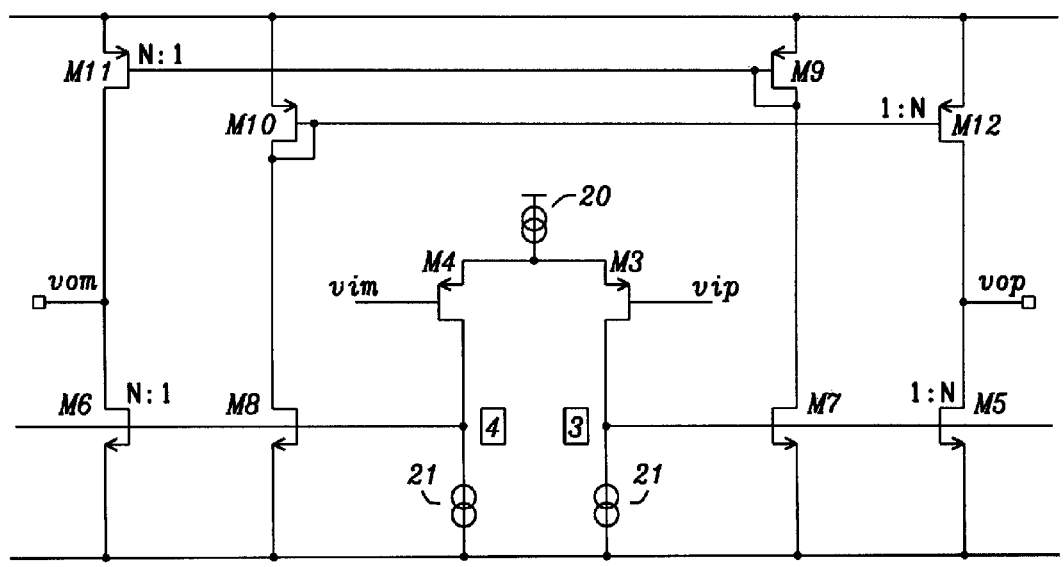
FIG. 2 illustrates a simplified schematic of a class-AB amplifier using differential drive principle.

FIG. 2 illustrates a simplified schematic of a class-AB amplifier using differential drive principle having two stages, an intermediate stage and an output stage. The output stage comprises two branches each generating respectively an output voltage Vop and Vom. A first output branch comprises high side device M12 and low side device M5, the second branch comprises high side device M11 and low side device M6. Furthermore the output stage comprises transistors M7 and M9 driving high side output transistor M11 and transistors M8 and M10 driving high side output transistor M12.

Figure 5A:
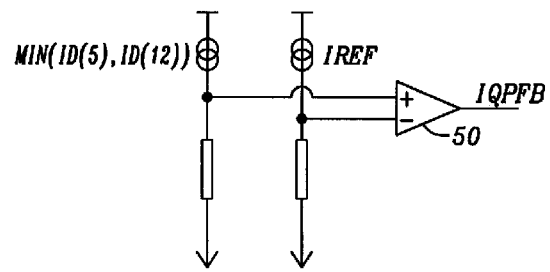
FIG. 5a illustrates how the output stage current sensing could be implemented (half bridge P).

Controlled current sources 20 and 21 are provided to supply the intermediate stage with current required. These current sources are controlled through the errors fed back from the class AB regulation loops as shown by FIG. 5a.

The PMOS differential pair M3/M4 of the intermediate stage amplifies an error (vip-vim) and generates on one hand a control signal of power PMOS transistors M11/M12 using respectively M7/M9 and M8/M10. Consequently a very simple differential pair can drive the power stage M11/M12 with a neat splitting between the power supply via VDD rail of the output stage and the supply intermediate stage. This allows supplying the output stage e.g. with low voltage level (<1 V), while the intermediate stage could be still supplied from a higher core voltage.

The amplifier of FIG. 2 shows how the differential amplification can be implemented using the differential drive principle, but it does not show how the common mode regulation and class-AB regulation could be implemented. Generally what happens is that any attempt to regulate the common mode by splitting the control of M5/M6 from the control of M11/M12 conflicts with quiescent current regulation.

Therefore the object of the disclosure is to cover a new arrangement for differential drive intermediate stage to control the differential loop, the common mode regulation and the class-AB regulation.

I Differential Loop

Figure 3:
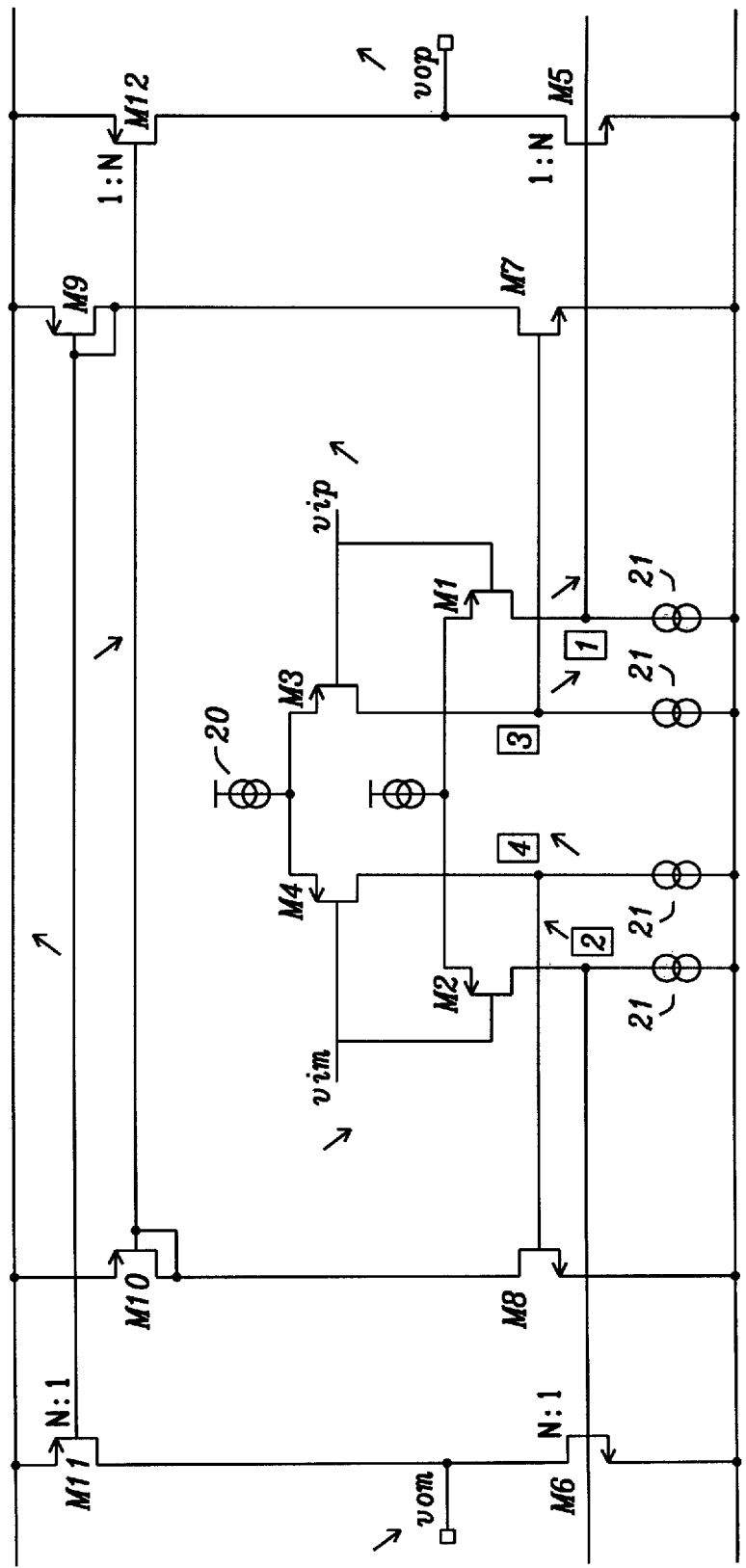
FIG. 3 illustrates a new arrangement of the intermediate stage to enable output common mode regulation.

FIG. 3 illustrates a new arrangement of the intermediate stage to enable output common mode regulation. The simplified schematic of FIG. 3 introduces dual differentiation of the main loop error signal to support common mode regulation by splitting the intermediate stage into two simple differential stages, one controlling the low side devices and the other controlling the high side devices, i.e. splitting the diving signals from M5/M6 from the control path of M11/M12.

The voltage error vip-vim is amplified through two separate paths:
1. differential pair M1/M2 to drive M5/M6, their gates are respectively node 1 and node 2.
2. differential pair M3/M4 to drive M11/M12, through respectively M7&M9 and M8&M10.

When voltage vip goes positive relative to voltage vim, nodes 1 and 3 are driven low to reduce drain currents of both transistors M5 and M11 while nodes 2 and 4 are driven high to increase the current of M6 and M12 simultaneously. Therefore the differential output (vop-vom) increases.

II Output Common Mode Regulation

Figure 4A:
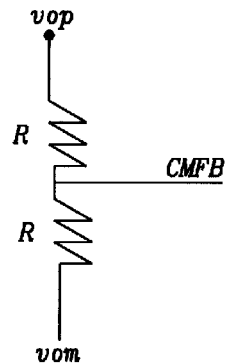
FIG. 4a shows one way of sensing the differential output common mode.

FIG. 4a shows one way of sensing the differential output common mode. The commode mode CMFB is sensed in the middle between of two resistances R located between voltages vop and vom.

Figure 4B:
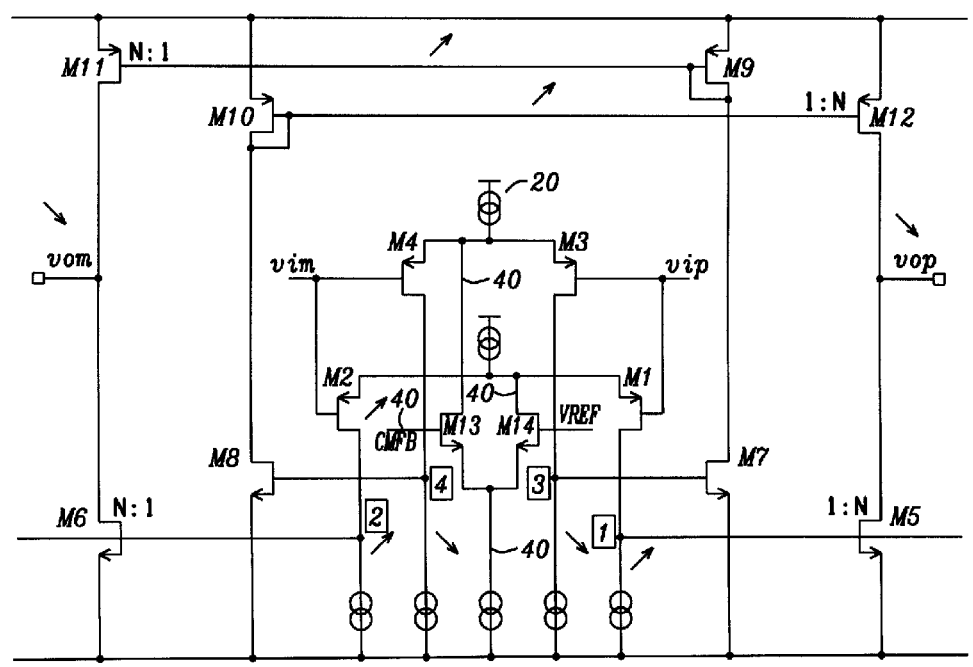
FIG. 4b presents a simplified schematic of a common mode regulation circuit.

FIG. 4b presents a simplified schematic of a common mode regulation circuit 40. The part of the circuit signified by 40 of the schematic of FIG. 4b show the common mode regulation circuit as part of the output driver. If the differential output common mode (CMFB) is higher than the common mode reference (VREF) then M13 will draw more current reducing the tail current of differential pair M3/M4 voltage of nodes 3 and 4 will tend to decrease, which makes M9 and M10 drain currents lower, therefore both "vop" and "vom" voltages will tend to decrease, reducing the common mode error.

Note that the high impedance nodes of the main loop are shared with the common mode regulation loop; therefore frequency compensation of both loops can be shared.

The new topology of FIG. 4b allows straightforward insertion of common mode regulation by imbalancing of the tail current of the intermediate stage differential pairs using M13/M14.

III Class—AB Regulation

The main benefit of the class-AB regulation presented is the control of the cross-conducted current inside the amplifier with or without presence of audio signals. One additional benefit is to ensure the devices of both output stages remain in linear region to minimize crossover distortion.

The principle is to sense the current of the device conducting the smallest current, compare it to an internal reference current in order to regulate the minimum current by modulating—in opposite phase—the gate drives of M12/M5 or M6/M11.

FIG. 5a illustrates how the output stage current sensing could be implemented (half bridge P) in order to generate a voltage IQPFB (respectively IQMFB for half bridge M), which are required to regulate the minimum current by using a differential amplifier 50.

Figure 5B:
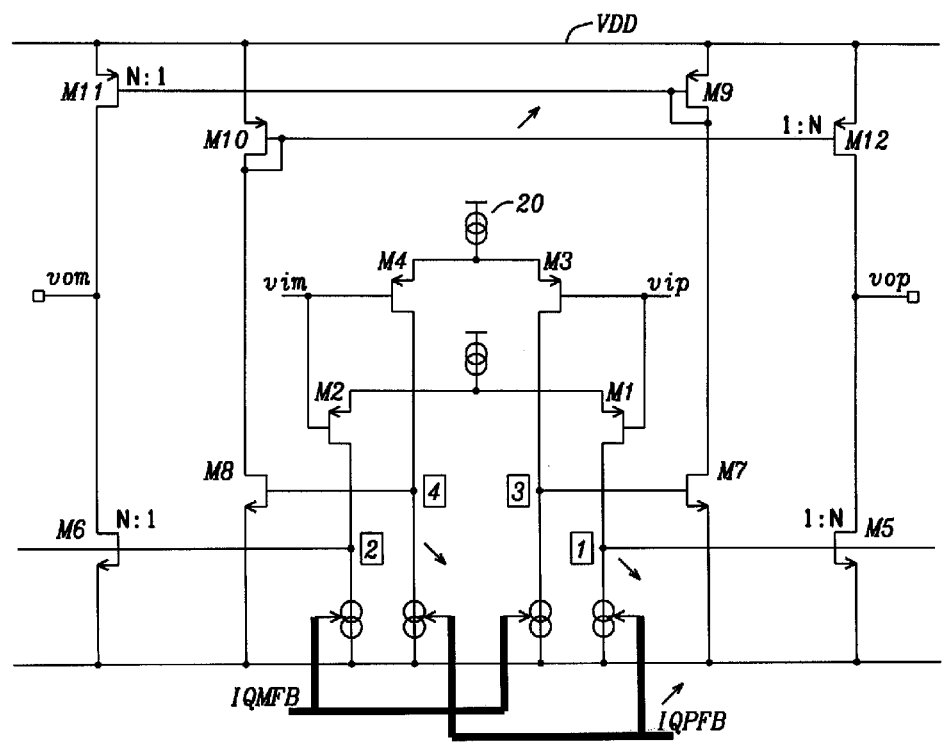
FIG. 5b depicts a simplified schematic of class-AB feedback.

FIG. 5b depicts a simplified schematic of class-AB feedback (bold lines). It shows an example of quiescent current regulation feedback. The part of the circuit of FIG. 5b regulating the quiescent current is shown with bold lines.

If the minimum output current in the power stage M5/M12 is higher than a predefined internal reference, the error between the two is scaling with feedback voltage IQPFB (respectively IQMFB) voltage and feeding back IQPFB to the active load connected to nodes 1 and 4 then node 1 and 4 voltages will decrease making currents in M5, M8, M0, and M12 lower the quiescent current.

Regulation of the quiescent current of output stage M6/M11 is implemented similarly by feeding feedback voltage IQFMFB to the active load connected to nodes 2 and 3.

In summary the dual differential pair of the intermediate stage combines four different feedbacks and all share four high impedance nodes:

Main loop regulation feedback (FIG. 3)
Common mode regulation feedback (FIG. 4b)
Output stage (P) quiescent current regulation (FIG. 5b)
Output stage (M) quiescent current regulation (FIG. 5b)

Figure 6:
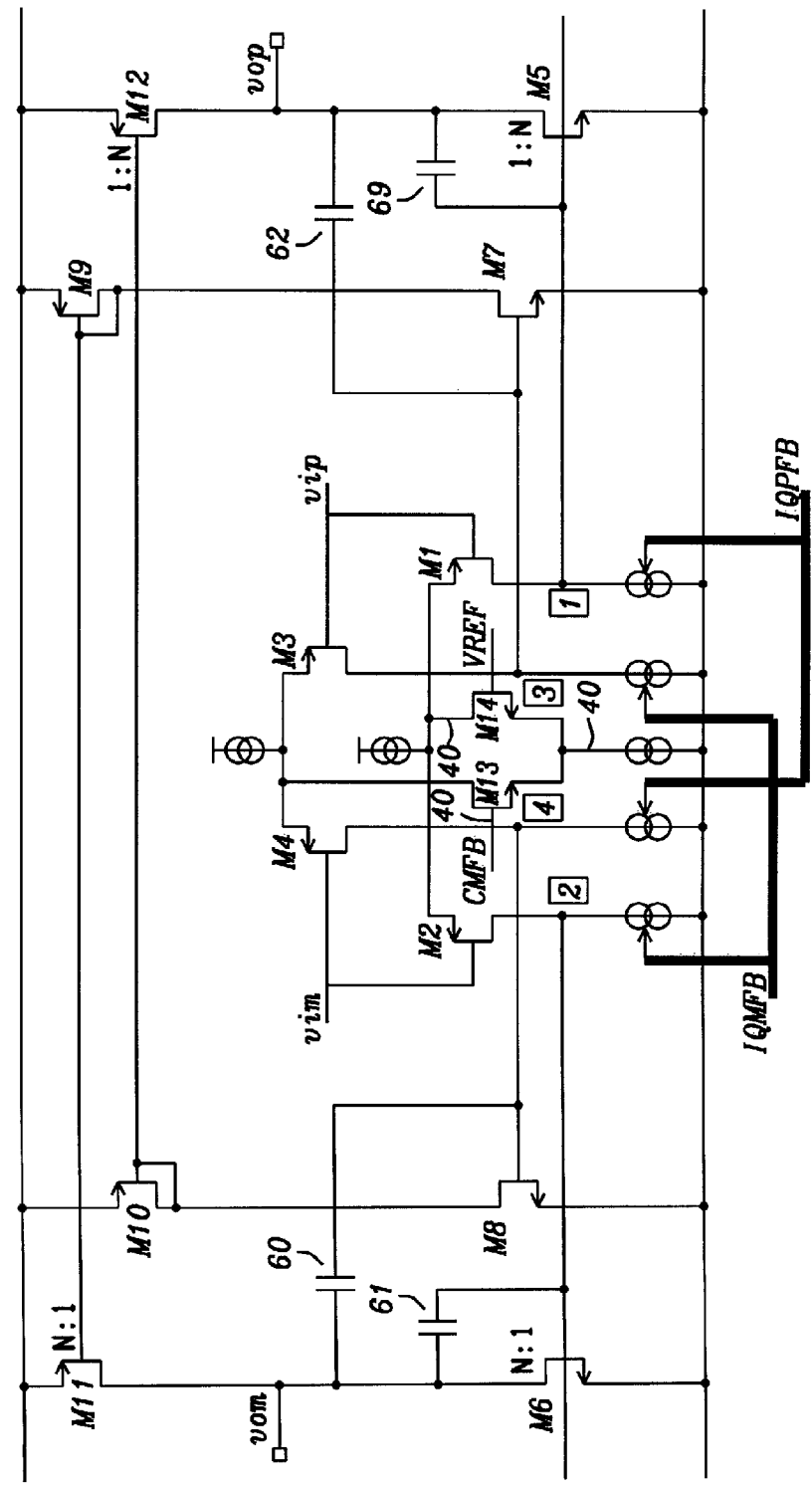
FIG. 6 shows a detailed schematic of the combined implementation of the four control loops.

FIG. 6 shows a detailed schematic of the combined implementation of the four control loops. The part of the circuit of FIG. 6 regulating the quiescent current is shown with bold lines. The part of the circuit of FIG. 6 performing common mode regulation is shown using numeral 40.

This allows straightforward insertion of Class-AB regulation by use of feedback to the active load of the same intermediate stage differential pairs. FIG. 6 shows as well how a straightforward Miller compensation of both output branches by capacitors 60-63 can be used to stabilize the four loops as they share the same high impedance nodes 1, 2, 3, and 4.

Alternatively MOSCAPS can be used for Miller compensation. In this case the MOSCAPS would have to be connected from nodes 1,2,3,4 to ground instead to the outputs as shown in FIG. 6 with capacitors 60-63.

As the high impedance nodes of the three regulation loops mentioned above are shared, compensation of the main loop improves also the stability of the common mode regulation loop and the class-AB regulation loop.

Figure 7:
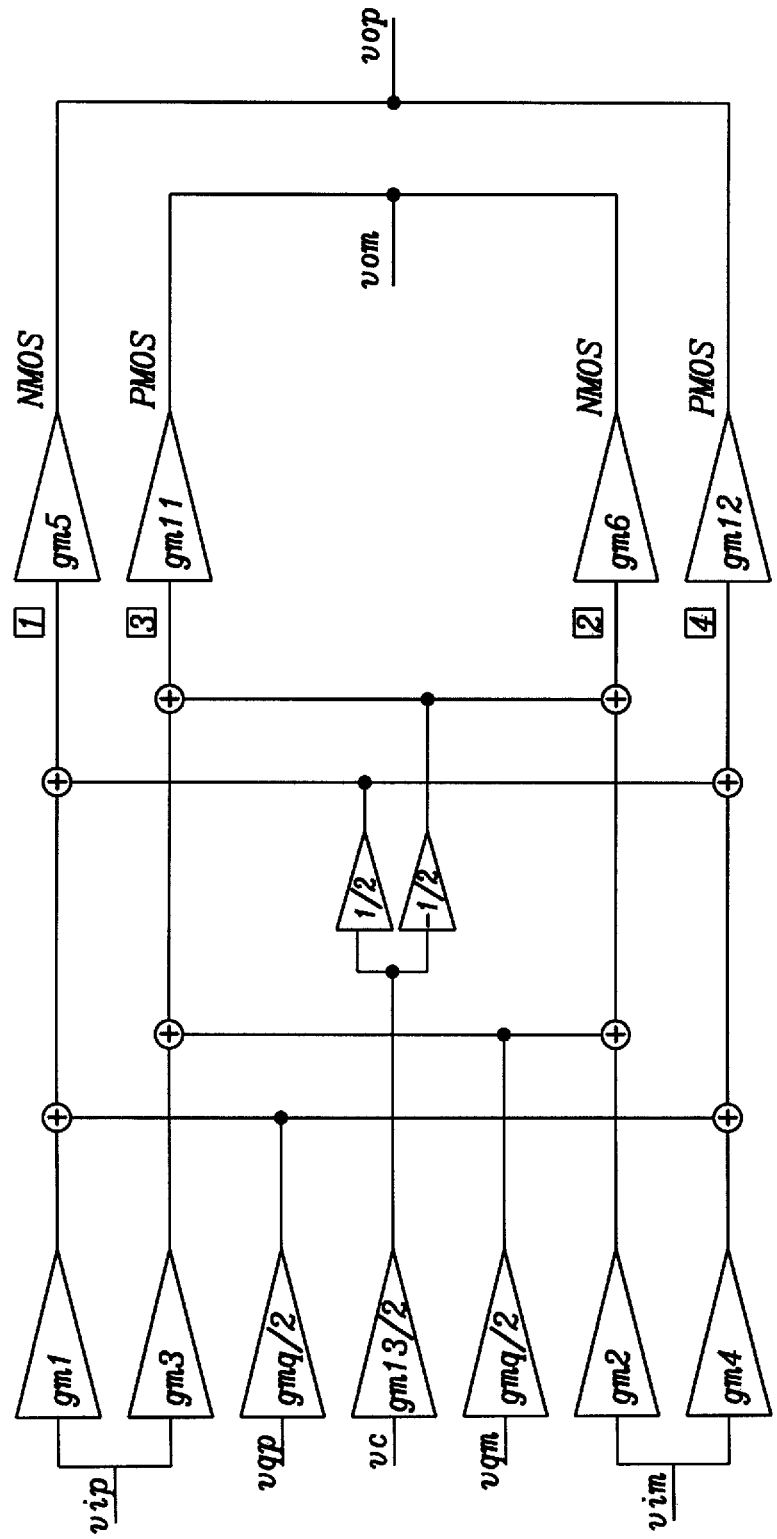
FIG. 7 illustrates a small signal model of the amplifier disclosed.

FIG. 7 shows as well as how a straightforward Miller compensation can be used to stabilize the four loops as they share the same high impedance nodes 1, 2, 3, and 4 as shown in FIG. 6., wherein in FIG. 7 vip/vim signifies the differential input, vc signifies the common mode error, vqp signifies the quiescent current error (P), and vqm signifies the quiescent current error (M).

The table below shows how each feedback loop relates to transconductances of FIG. 6:

| Transconductance | Regulation loop | Error signal |
|---|---|---|
| gm1 = gm2 = gm3 = gm4 | Differential | Vip-vim |
| gm13 = gm14 | Output common mode | vc |
| gmq (P side) | Quiescent current (P side) | vqp |
| gmq (M side) | Quiescent current (M side) | vqm |

Figure 8:
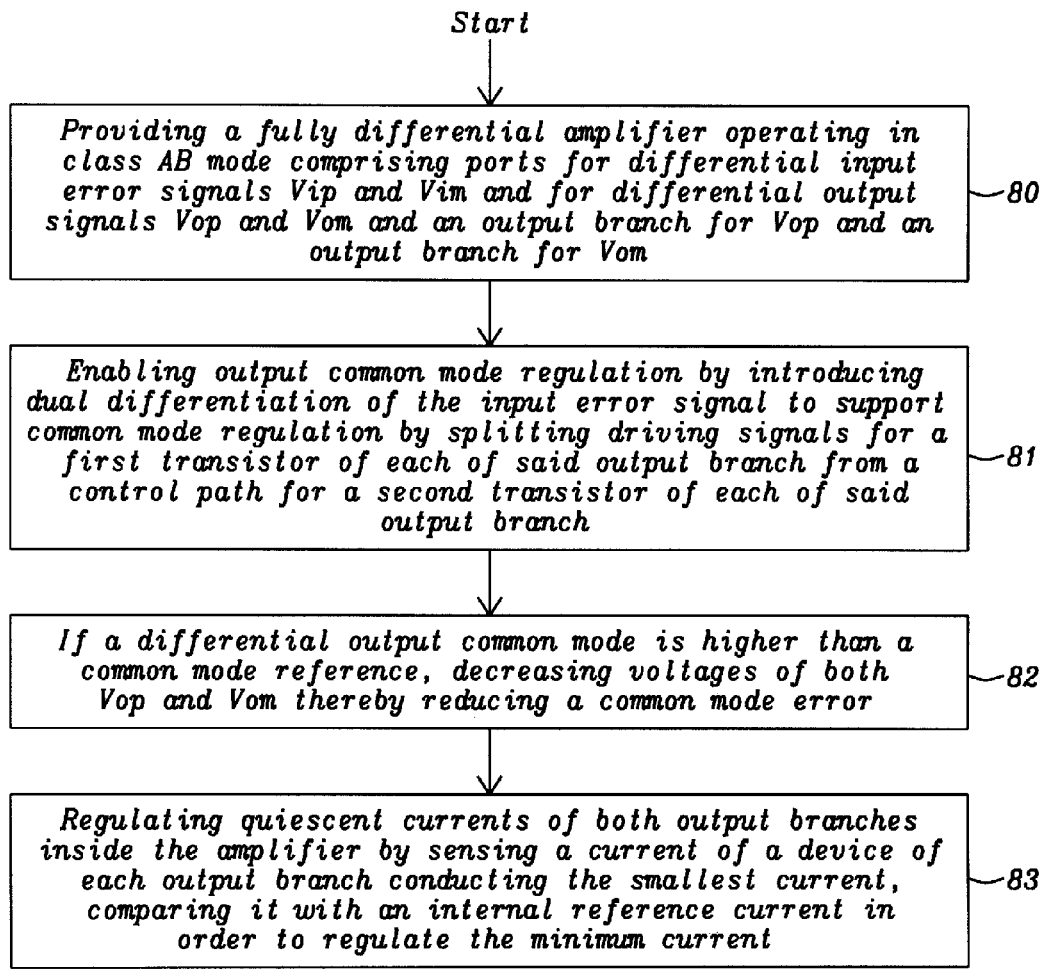
FIG. 8 illustrates a flowchart of a method to achieve a fully differential amplifier operating in class AB mode, comprising an arrangement for differential drive intermediate stage to control a differential loop, a common mode regulation and class AB regulation.

FIG. 8 illustrates a flowchart of a method to achieve a fully differential amplifier operating in class AB mode, comprising an arrangement for differential drive intermediate stage to control a differential loop, a common mode regulation and class AB regulation. Step 80 of the method of FIG. 8 illustrates the provision of a fully differential amplifier operating in class AB mode comprising ports for differential input error signals Vip and Vim and for differential output signals Vop and Vom and an output branch for Vop and an output branch for Vom. Step 81 depicts enabling output common mode regulation by introducing dual differentiation of the input error signal to support common mode regulation by splitting driving signals for a first transistor of each of said output branch from a control path for a second transistor of each of said output branch. Step 82 illustrates that if a differential output common mode is higher than a common mode reference, decreasing voltages of both Vop and Vom, thereby reducing a common mode error and, finally, step 83 illustrates regulating quiescent currents of both output branches inside the amplifier by sensing a current of a device of each output branch conducting the smallest current, comparing it with an internal reference current in order to regulate the minimum current.

In summary, main points of the disclosure are:

New linear amplifier operating in class AB mode, comprising method of differential amplification, common mode regulation, and class AB regulation.

Novel method of generating the output stage control signals by splitting the intermediate stage into two simple differential stages, one controlling the low side devices and the other controlling the high side devices.

The new topology allows a neat splitting between the power supply of the output stage and the intermediate stage.

The disclosure gives the possibility of supplying the output stage with low voltage level (<1 V), while the intermediate stage could be still supplied from a higher core voltage.

The new topology allows straightforward insertion of common mode regulation by imbalancing of the tail current of the intermediate stage differential pairs.

The disclosure prevents power supply feed-forward through compensation capacitors as the gate of the high side devices is no longer a high impedance node, hence improving PSR in the audio band.

The disclosed architecture allows straightforward insertion of Class-AB regulation by use of feedback to the active load of the same intermediate stage differential pairs.

As the high impedance nodes of the three regulation loops mentioned above are shared, compensation of the main loop benefits also the stability of the common mode regulation loop and the class-AB regulation loop.

Output stage PMOS devices are driven in current mirror configuration, hence the gate of the PMOS is naturally clamped and protected from breakdown in case low voltage power devices are used.

Furthermore it should be noted that an adaptation to Class G operation is straightforward with the current disclosure since the supply rail of the power stage is not shared with the supply rail of the control circuit of the main loop, common mode loop and Class AB regulation loop. Therefore switched supply can be easily connected to the power stage without any interaction with the core supply rails (generally low noise and well decoupled).

Moreover it should be noted that the disclosure could be applied not only to audio amplifiers but also to any other suitable amplifier application.

While the disclosure has been particularly shown and described with reference to the preferred embodiments thereof, it will be understood by those skilled in the art that various changes in form and details may be made without departing from the spirit and scope of the disclosure.

What is claimed is:

1. A method to achieve a fully differential amplifier operating in class AB mode, comprising an arrangement for differential drive intermediate stage to control a differential loop, a common mode regulation and class AB regulation, comprising the following steps:
   (1) providing a fully differential amplifier operating in class AB mode comprising ports for differential input error signals Vip and Vim and for differential output signals Vop and Vom, wherein Vop is generated by a first output branch and Vom is generated by a second output branch, wherein the output branches are arranged in parallel between supply rails, wherein each output branch comprising high side and low side devices, and wherein the amplifier comprises an output stage and an intermediate stage processing the input signals and a power stage;
   (2) enabling differential output regulation by introducing dual differentiation of the input error signal to support common mode regulation by splitting driving signals for a first transistor of each of said output branch from a control path for a second transistor of each of said output branch;
   (3) reducing a common mode error by decreasing both voltages Vop and Vom if a differential output common mode is higher than a common mode reference; and
   (4) regulating quiescent currents of both output branches inside the amplifier by sensing a current of a device of each output branch conducting the smallest current, comparing it with an internal reference current in order to regulate the minimum current.

2. The method of claim 1 wherein the amplifier is operating as an audio amplifier.

3. The method of claim 1 wherein said regulation of the minimum current is performed by modulating gate drives of all devices of each output branch.

4. The method of claim 1 wherein said splitting driving signals is performed by splitting the intermediate stage into two simple differential stages, one controlling the low side devices and the other controlling the high side devices.

5. The method of claim 1 wherein power supply is split between supply of the output stage via a VDD rail and the supply of the intermediate stage.

6. The method of claim 5 wherein supplying the output stage with a voltage level of about lower than 1 V, while the intermediate stage could be still supplied from a higher core voltage.

7. The method of claim 1 wherein straightforward insertion of common mode regulation by imbalancing of tail current of intermediate stage differential pairs is enabled.

8. The method of claim 1 wherein PSR in the audio band is improved by preventing power supply feed-forward through compensation capacitors.

9. The method of claim 7 wherein a straightforward insertion of Class-AB regulation by use of feedback to the active load of the same intermediate stage differential pairs is enabled.

10. The method of claim 1 wherein compensation of the main loop improves stability of the common mode regulation loop and of the class-AB regulation loop by high impedance nodes of the regulation loops being shared.

11. The method of claim 1 wherein an adaptation to class-G operation can be performed by connecting switched supply to a power stage.

12. A circuit of a fully differential amplifier operating in class AB mode, comprising:
   a differential output stage comprising a P and an M branch, wherein each branch comprises a high side device and a low side device;
   a differential intermediate stage comprising
      a first pair of PMOS transistors comprising a first and a second PMOS transistor, amplifying a differential input error signal wherein each transistor generates a driving signal for a correspondent said low side device and a control signal to a correspondent said high side device, wherein the sources of both transistors are connected;
      a first pair of NMOS transistors wherein a gate of each NMOS transistor is connected at a correspondent high impedance node to a drain of a correspondent transistor of the first pair of PMOS transistors and a drain of each NMOS transistor is connected to a drain and a gate of a correspondent PMOS transistor of a second pair of PMOS transistors;
      said second pair of PMOS transistors, wherein each gate of the second pair of PMOS transistors is connected to a gate of a correspondent high side device forming a current mirror, wherein each of the PMOS transistors of the second pair is scaled down in a same scale relative to the high side devices;
   a loop control circuit;
   a common mode regulation loop circuit; and
   a class AB regulation loop.

13. The circuit of claim 12 wherein the amplifier is operating as an audio amplifier.

14. The circuit of claim 12 wherein the output stage is supplied by a voltage lower than 1V.

15. The circuit of claim 14 wherein the intermediate stage is supplied by a voltage that is higher than a supply voltage of the output stage.

16. The circuit of claim 12 wherein said common mode regulation loop circuit comprises:

a third pair of PMOS transistors in parallel to said first pair of transistors, wherein each transistor of the third pair of the PMOS transistors is controlling respectively a low side device of a correspondent output branch via a respective high impedance node and each transistor of the first pair of PMOS transistors is controlling respectively a high side device via a respective high impedance node, wherein the sources of both transistors of the third PMOS pair are connected; and a second pair of NMOS transistors, wherein a drain of a first transistor of the second pair of NMOS transistors is connected to the sources of the first pair of PMOS transistors, a gate of the first transistor of the second pair of NMOS transistors is connected to a common mode feedback sensed, a drain of a second transistor of the second pair of NMOS transistors is connected to sources of the third pair of PMOS transistors, and a gate of the second transistor of the second pair of NMOS transistors is connected to common mode reference voltage.

17. The circuit of claim 16 wherein the high impedance nodes are shared with the high impedance nodes of the common mode regulation loop enabling sharing of frequency compensation of both loops.

18. The circuit of claim 16 wherein said class AB regulation loop circuit can be accomplished by adding a voltage IQPFB, which is scaling with an quiescent current error of the P branch, to the high impedance nodes controlling the P branch, and by adding a voltage IQMFB, which is scaling with an quiescent current error of the M branch, to the high impedance nodes controlling the M branch.

19. The circuit of claim 16 wherein in order to achieve frequency compensation a capacitor is added between the M branch and each of the high impedance nodes controlling the M branch and by adding a capacitor between the P branch and each of the high impedance nodes controlling the P branch.

20. The circuit of claim 16 wherein in order to achieve frequency compensation a MOS capacitor is added between ground and each of the high impedance nodes controlling the M branch and by adding a capacitor ground and each of the high impedance nodes controlling the P branch.

21. The circuit of claim 16 wherein all regulation loops share the four high impedance nodes.

22. The circuit of claim 16 wherein an insertion of common mode regulation is enabled by imbalancing of the tail current of the differential fourth pair of PMOS transistors of the intermediate stage.

23. The circuit of claim 16 wherein an insertion of class AB regulation is enabled by using feedback to active load to the high impedance nodes.

24. The circuit of claim 12 wherein an adaptation to class-G operation can be performed by connecting switched supply to a power stage.

* * * * *